US009363033B2

(12) United States Patent
Dutta et al.

(10) Patent No.: US 9,363,033 B2
(45) Date of Patent: Jun. 7, 2016

(54) MULTIPLEXED PULSE MODULATION USING SUPERPOSITION

(75) Inventors: Partha S. Dutta, Clifton Park, NY (US); Sruthi Muralidharan, Troy, NY (US)

(73) Assignee: RENSSELAER POLYTECHNIC INSTITUTE, Troy, NY (US)

( * ) Notice: Subject to any disclaimer, the term of this patent is extended or adjusted under 35 U.S.C. 154(b) by 157 days.

(21) Appl. No.: 14/002,198

(22) PCT Filed: Jan. 10, 2012

(86) PCT No.: PCT/US2012/020698
§ 371 (c)(1),
(2), (4) Date: Aug. 29, 2013

(87) PCT Pub. No.: WO2012/118567
PCT Pub. Date: Sep. 7, 2012

(65) Prior Publication Data
US 2013/0336659 A1      Dec. 19, 2013

Related U.S. Application Data

(60) Provisional application No. 61/464,247, filed on Mar. 1, 2011.

(51) Int. Cl.
*H04J 14/08* (2006.01)
*H04B 10/11* (2013.01)
(Continued)

(52) U.S. Cl.
CPC ............... *H04J 14/08* (2013.01); *H04B 10/11* (2013.01); *H03K 7/02* (2013.01); *H03K 7/08* (2013.01);
(Continued)

(58) Field of Classification Search
CPC .... H04B 10/11; H04B 10/502; H04B 10/504; H04B 10/5059; H04B 10/508; H04B 10/524; H04B 10/505; H04B 10/5051; H04B 10/152; H04B 10/026; H04B 14/02; H04J 14/08; G01D 5/243; G01S 13/78; G06F 3/033; H03K 7/08; H03K 7/04; H03K 7/02; H04L 25/4902; H04L 25/4917; H04L 27/2647; H04L 27/2657; H04L 5/0007; H03F 3/217
USPC .................................. 398/189, 190, 191, 98
See application file for complete search history.

(56) References Cited

U.S. PATENT DOCUMENTS 6,885,826 B2 * 4/2005 Kropp .................. H04B 10/506
                                                            398/182
2004/0170439 A1   9/2004 Hiironen
2009/0162077 A1 * 6/2009 Dress ..................... H04B 14/04
                                                            398/190

FOREIGN PATENT DOCUMENTS

JP      2001-086070      3/2001
KR   10-2010-0055175     5/2010

OTHER PUBLICATIONS

Adachi et al., "Wideband DS-CDMA for Next-Generation Mobile Communications Systems," IEEE Communications Magazine, Sep. 1998, pp. 56-69.

(Continued)

*Primary Examiner* — M. R. Sedighian
(74) *Attorney, Agent, or Firm* — RatnerPrestia (57) ABSTRACT

The present invention relates to an optical transmitter for transmitting data. The optical transmitter includes a pulse generator for generating N data streams overlapping in time from a de-multiplexed data source. Each respective data stream has pulses with shapes unique to that respective data stream. The transmitter also includes an optical source optically transmitting an output pulse that is generated by summing the uniquely shaped pulses from each respective data stream that are overlapping in time. Each output pulse represents N bits of the data source, where N>1.

6 Claims, 8 Drawing Sheets

(51) Int. Cl.
 *H04L 25/49* (2006.01)
 *H03K 7/02* (2006.01)
 *H04B 10/508* (2013.01)
 *H04B 10/50* (2013.01)
 *H04B 14/02* (2006.01)
 *H03K 7/08* (2006.01)

(52) U.S. Cl.
 CPC ............. *H04B 10/502* (2013.01); *H04B 10/504* (2013.01); *H04B 10/508* (2013.01); *H04B 14/02* (2013.01); *H04L 25/4902* (2013.01)

(56) References Cited

OTHER PUBLICATIONS

Korean IPO Search Report for PCT/US2012/020698 mailed Aug. 17, 2012.

\* cited by examiner

MULTIPLEXED PULSE MODULATION USING SUPERPOSITION

CROSS REFERENCE TO RELATED APPLICATIONS

This application is the U.S. National Phase Application of PCT/US2012/020698, filed Jan. 10, 2012, which claims the benefit of priority to U.S. Provisional Application Serial No. 61/464,247, filed Mar. 1, 2011, the disclosure of which is incorporated in its entirety by reference herein for all purposes.

FIELD OF THE INVENTION

The present invention relates, in general, to a modulation system and method. Specifically, a data source stream is time-wise de-multiplexed or inverse multiplexed into N data streams that overlap in time. Each de-multiplexed data stream utilizes unique pulses to represent data bits (e.g. a logic 1) during transmission. The de-multiplexed data streams may have pulses with unique duty cycles, amplitudes, phase shifts or a combination of the three. Superposition (i.e. summation) of the unique pulses, allows $2^N$ unique output pulses (i.e. unique in shape) to be generated where each of the output pulses represents N bits of data (i.e. a single output pulse represents N bits).

BACKGROUND OF THE INVENTION

In conventional communication systems, a variety of modulation techniques varying pulse amplitude, pulse frequency, pulse phase and pulse position have been implemented. However, these conventional systems typically avoid superposition (i.e. the time-wise summation) of two or more transmission signals to avoid transmission errors. These conventional systems are therefore limited in their throughput capabilities.

SUMMARY OF THE INVENTION

To meet this and other needs, and in view of its purposes, an aspect of the present invention provides an optical transmitter for transmitting data. The transmitter includes a pulse generator generating N data streams overlapping in time from a de-multiplexed data source. Each respective data stream has pulses with shapes unique to that respective data stream. The transmitter also includes an optical source optically transmitting an output pulse that is generated by summing the uniquely shaped pulses from each respective data stream that are overlapping in time. Each output pulse represents N bits of the data source, where N>1.

In another aspect, the optical transmitter also includes N light emitting diodes (LEDs) that transmit the N respective data streams. The output pulse is generated by optically summing the uniquely shaped optical pulses transmitted from the N LEDs.

In a further aspect, the optical transmitter also includes an adder that electrically sums the uniquely shaped pulses to produce the output pulse. The optical source is a light emitting diode (LED) that transmits the output pulse.

In yet another aspect, the N uniquely shaped pulses have unique duty cycles to produce $2^N$ output pulses. In another example, the N uniquely shaped pulses have unique amplitudes to produce $2^N$ output pulses. In another example, the N uniquely shaped pulses have unique phases to produce $2^N$ output pulses. In another example, the N uniquely shaped pulses have at least two of unique duty cycles, unique amplitudes and unique phases to produce $2^N$ output pulses.

In one aspect, the present invention also provides an optical receiver for receiving transmitted data. The optical receiver includes a photo-sensor for receiving optical pulses from a transmitter, and converting the optical pulses into electrical pulses. Each optical pulse is a summation of uniquely shaped pulses from N data streams that are overlapping in time, and each electrical pulse represents N bits of a data source from which the N data streams are generated, where N>1. The receiver also includes a processor generating the N data streams from the electrical pulses, and multiplexing the N data streams to reproduce the data source.

In another aspect, the optical receiver includes an analog to digital converter to digitally convert the electrical pulses, and a decoder to generate the N data streams and reproduce the data source based on the digitally converted electrical pulses. In another example, the optical receiver includes a correlation receiver performing N correlations on the electrical pulses to generate the N data streams and reproduce the data source.

In a further aspect, the decoder includes a multiplexer that timewise multiplexes the N data streams to reproduce the data source. In another example, the correlation receiver includes a multiplexer that timewise multiplexes the N data streams to reproduce the data source. In another example, the N uniquely shaped pulses have unique duty cycles to produce $2^N$ optical pulses. In another example, the N uniquely shaped pulses have at least two of unique duty cycles, unique amplitudes, and unique phases to produce $2^N$ optical pulses.

In yet another aspect, the present invention provides a radio frequency (RF) transmitter for transmitting data. The RF transmitter includes a pulse generator generating N data streams overlapping in time from a de-multiplexed data source. Each respective data stream having pulses with shapes unique to that respective data stream. The RF transmitter also includes an antenna transmitting an output pulse that is generated by summing the uniquely shaped pulses from each respective data stream that are overlapping in time. Each output pulse represents N bits of the data source, where N>1.

In still another aspect, the RF transmitter includes an adder that electrically sums the uniquely shaped pulses to produce the output pulse, and a multiplier that modulates a local oscillator based on the output pulse. The modulated output pulse is transmitted by the antenna.

In a further aspect, the RF transmitter includes a filter for filtering the modulated output pulse. In one example, the RF transmitter includes an amplifier for amplifying the filtered pulse. In another example, the N uniquely shaped pulses have unique duty cycles to produce $2^N$ output pulses. In another example, the N uniquely shaped pulses have at least two of unique duty cycles, unique amplitudes and unique phases to produce $2^N$ output pulses.

DETAILED DESCRIPTION

As will be described, the present invention provides a system and a method for performing modulation using superposition of pulses. Specifically, pulses of a data source may be de-multiplexed or inverse multiplexed over time to form N data streams (i.e. N channels) that overlap in time. Each of the N data steams transmits a pulse to represent a logic 0 or 1. The pulse for a given data stream has a unique shape (e.g., unique duty cycle, amplitude, phase shift, or a combination) with respect to the pulses in the other data streams. Each of the N data streams are either summed up before transmission or are summed up during transmission by way of superposition (i.e. the N pulses are combined to produce a single output pulse representing N bits). Since each of the N data streams utilizes a unique pulse from the other data streams for transmitting, for example, a logic 1, then the superposition of the N data streams will result in $2^N$ unique transmission pulses (including the null pulse) that are distinguishable at the receiver. Thus, the throughput of the system is increased because each of the output transmission pulses represents N bits of data.

Figure 1:
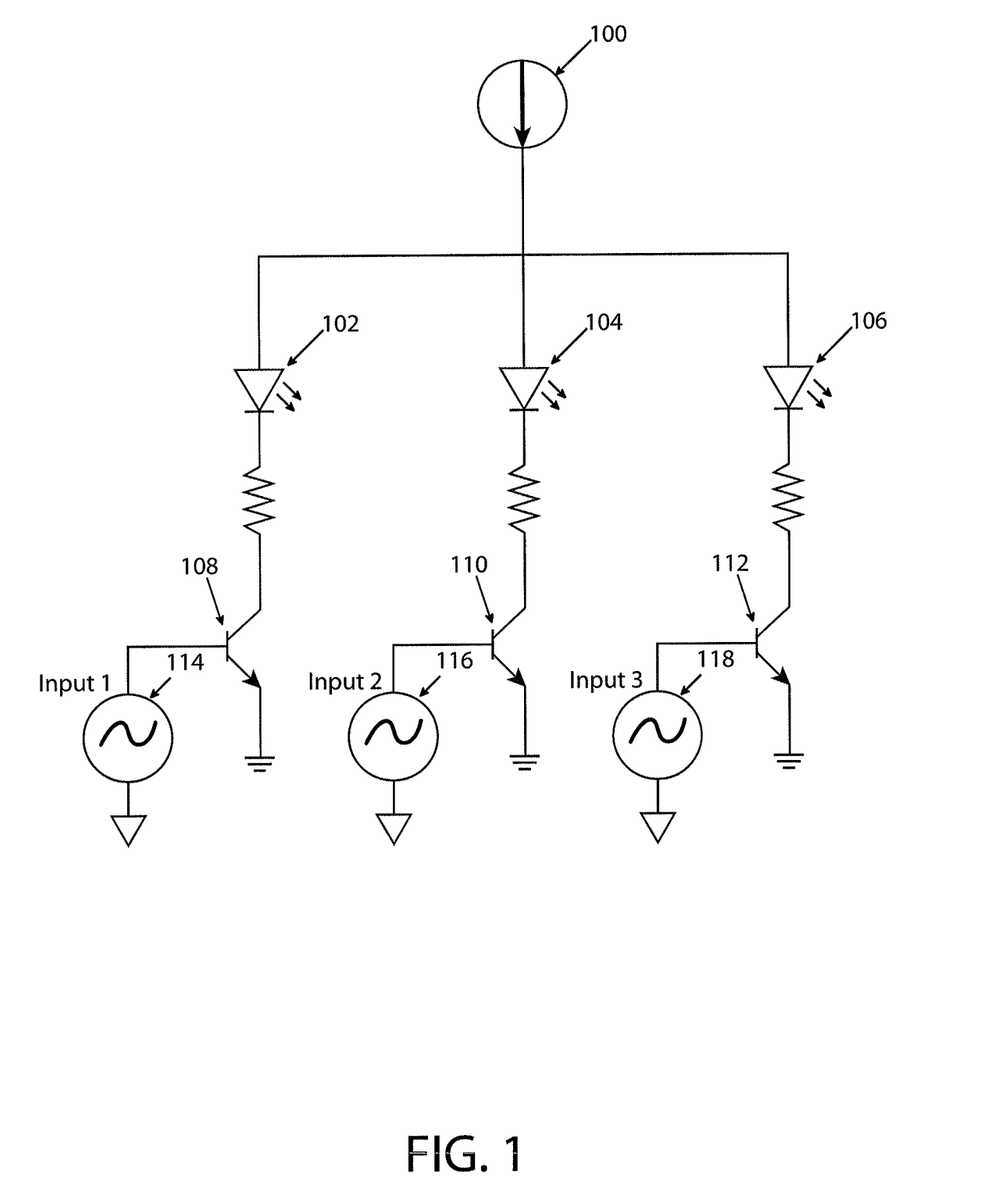
FIG. 1 is a circuit schematic of an optical transmitter having N optical sources, according to an exemplary embodiment of the present invention.

Shown in FIG. 1 is an exemplary embodiment of an optical transmitter for implementing the modulation technique. Specifically, the optical transmitter includes a current source 100, LEDs 102, 104 and 106, switches (e.g. transistors) 108, 110 and 112, and three data streams 114, 116 and 118.

During operation, a data source may be de-multiplexed into the three overlapping data streams 114, 116 and 118. Although three data streams are utilized in this example, it is noted that N data streams may be generated from the source stream(s). The de-multiplexing of the data source is not shown in FIG. 1.

During operation, data stream 1 (i.e. input 1) is able to modulate the current through LED 102 via transistor 108. Similarly, data stream 2 (i.e. input 2) is able to modulate the current through LED 104 while data stream 3 (i.e. input 3) is able to modulate the current through LED 106. Thus, the three data streams are able to modulate the intensity of the light, the duty cycle of the light and phase shift of the light emitted by LEDs 102, 104 and 106.

As described above, each of the data streams 114, 116 and 118 utilize a pulse that has a unique shape. This pulse represents either a logic 0 or a logic 1 during transmission.

During transmission, the optical pulses emitted from LED 102, 104 and 106 are summed together (i.e. the light combines) through superposition to form a single transmission pulse. In general, since each of the three data streams has a uniquely shaped pulse, the output transmission pulse after superposition results in $2^N$ uniquely shaped pulses including the null pulse.

Figure 2:
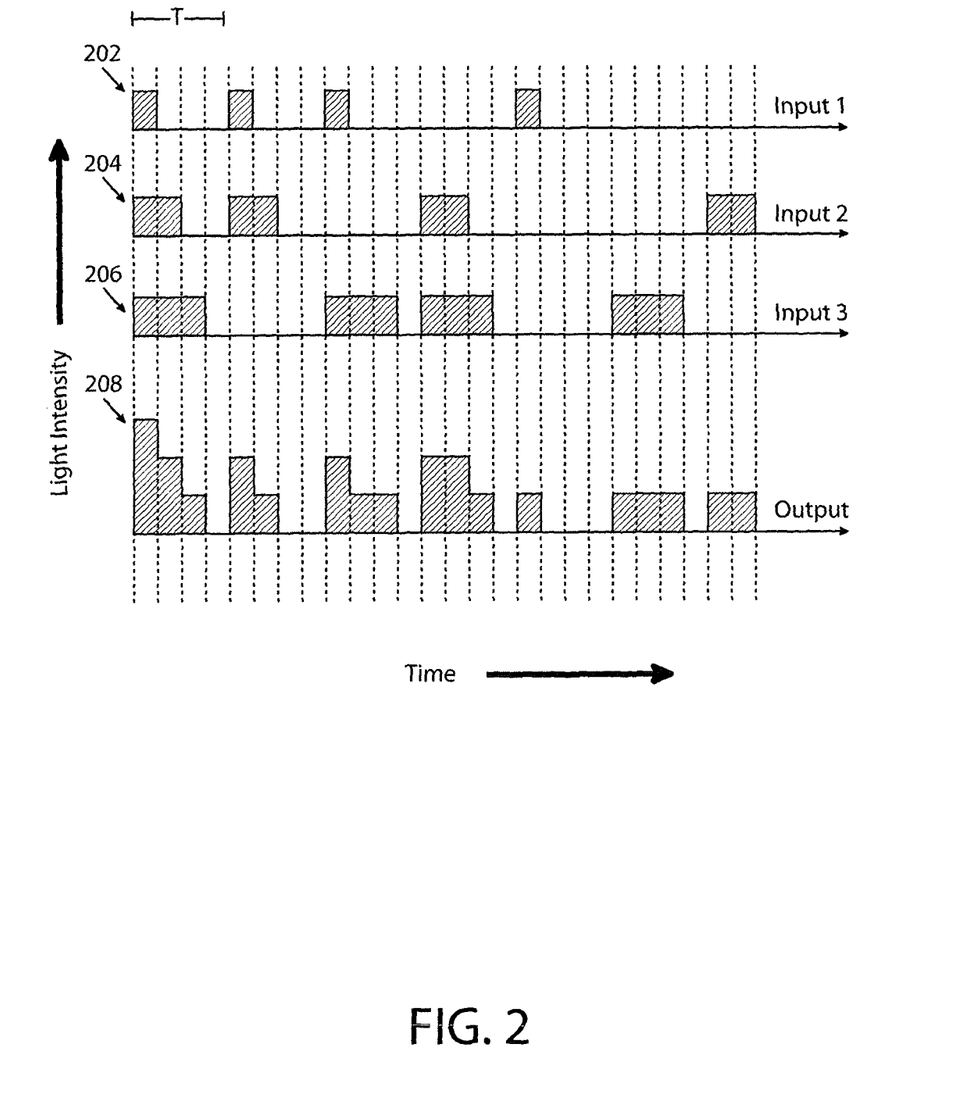
FIG. 2 is a plot of three data channels having unique duty cycles and their resulting output pulses, according to an exemplary embodiment of the present invention.

For example, as shown in FIG. 2 the three data streams (input 1, input 2 and input 3) have already been de-multiplexed from the data source and are overlapping in time. The pulses utilized in data stream 1 have a 25% duty cycle over bit period T, whereas the pulses utilized in data stream 2 have a 50% duty cycle and the pulses in data steam 3 have a 75% duty cycle (i.e. each data stream uses pulses with a unique duty cycle).

The seven possible combinations of data stream 1, 2 and 3 are shown in FIG. 2 that produce $2^{N-1}$ output pulses (excluding the null pulse which is not shown). For example, during the first bit period in FIG. 2, data pulse 202, 204 and 206 (i.e. 111) combine during superposition (they are summed optically) which results in an output optical pulse having light intensity 208. It is shown that the remaining output pulses for the other combinations of the input pulses (i.e., 010, 110, 101, 011, 100, 001 and 000) result in output pulses that are unique from each other.

In general, the superposition of optical or electrical pulses is the summation of the pulse intensities over time. Thus, when the light pulses are transmitted from individual LEDs 102, 104 and 106, they sum together (i.e. combine) to form a single output pulse which is optically received by the receiver.

Although FIG. 2 shows that the three data streams have pulses with unique duty cycles, it is also contemplated that the pulses in the three data streams may have unique duty cycles, unique amplitudes, unique phase shifts and/or a combination of the three.

Figure 3:
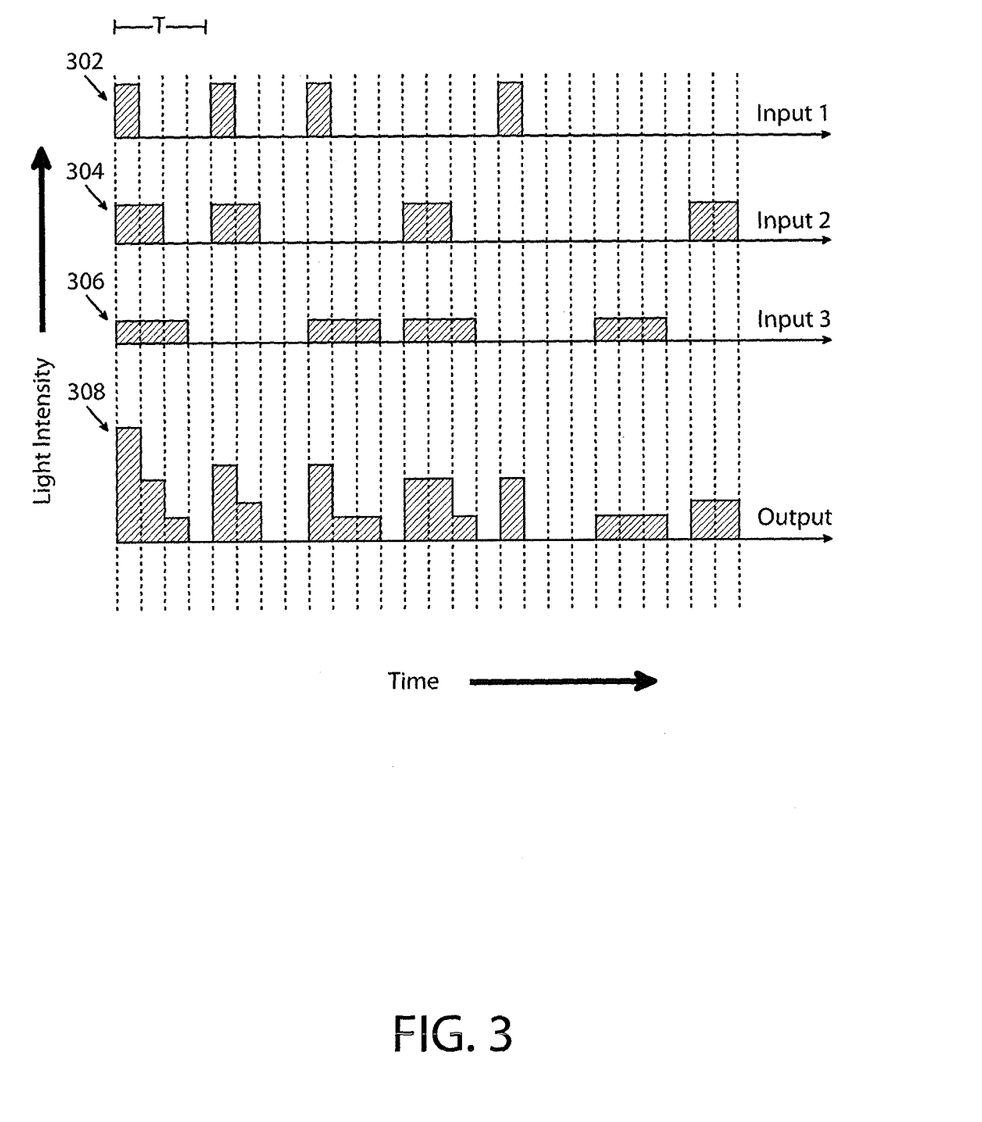
FIG. 3 is a plot of three data channels having unique duty cycles and amplitudes, and their resulting output pulses, according to an exemplary embodiment of the present invention.

For example, as shown in FIG. 3, the three data streams have a 25%, 50% and 75% duty cycle (similar to FIG. 1), but also have different amplitudes (i.e., the pulses in data stream 1 have a large amplitude, the pulses in data stream 2 have a medium amplitude and the pulses in data stream 3 have a small amplitude). Thus, in one example, pulses 302, 304 and 306 of the three different streams combine during superposition to form output pulse 308.

Figure 4:
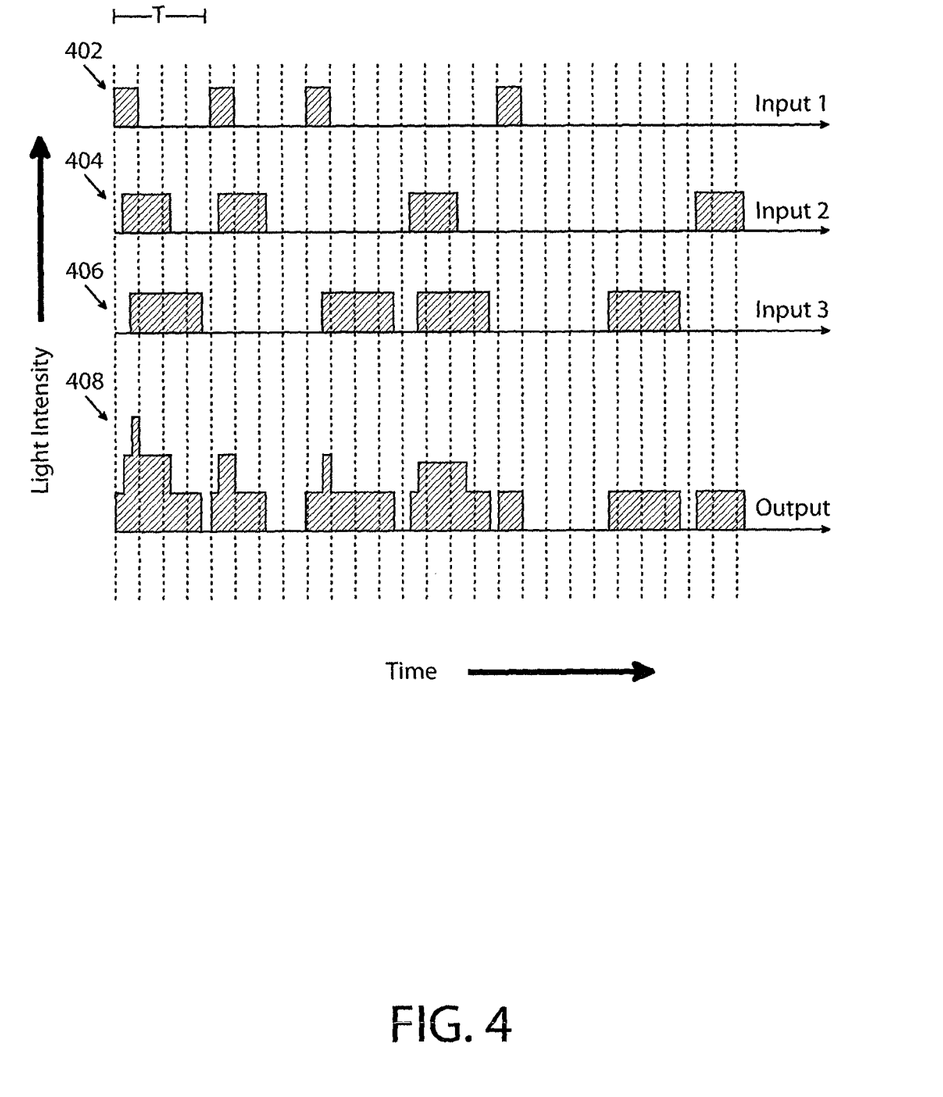
FIG. 4 is a plot of three data channels having unique duty cycles and phase shifts, and their resulting output pulses, according to an exemplary embodiment of the present invention.

In another example, as shown in FIG. 4, the three data streams have 25%, 50% and 75% duty cycles (similar to FIG. 1), but also have different phase shifts with respect to each other (i.e., the pulses in data stream 1 do not have a phase shift, the pulses in data stream 2 have a small phase shift and the pulses in data stream 3 have a larger phase shift). Thus, in one example, pulses 402, 404 and 406 (when combined during superposition) produce output pulse 408.

In general, the duty cycles, amplitudes, phases or any combination of two or three may be implemented to ensure that the output pulses (i.e., the pulses after super position) are unique from each other and can be distinguished at the receiver.

Figure 5:
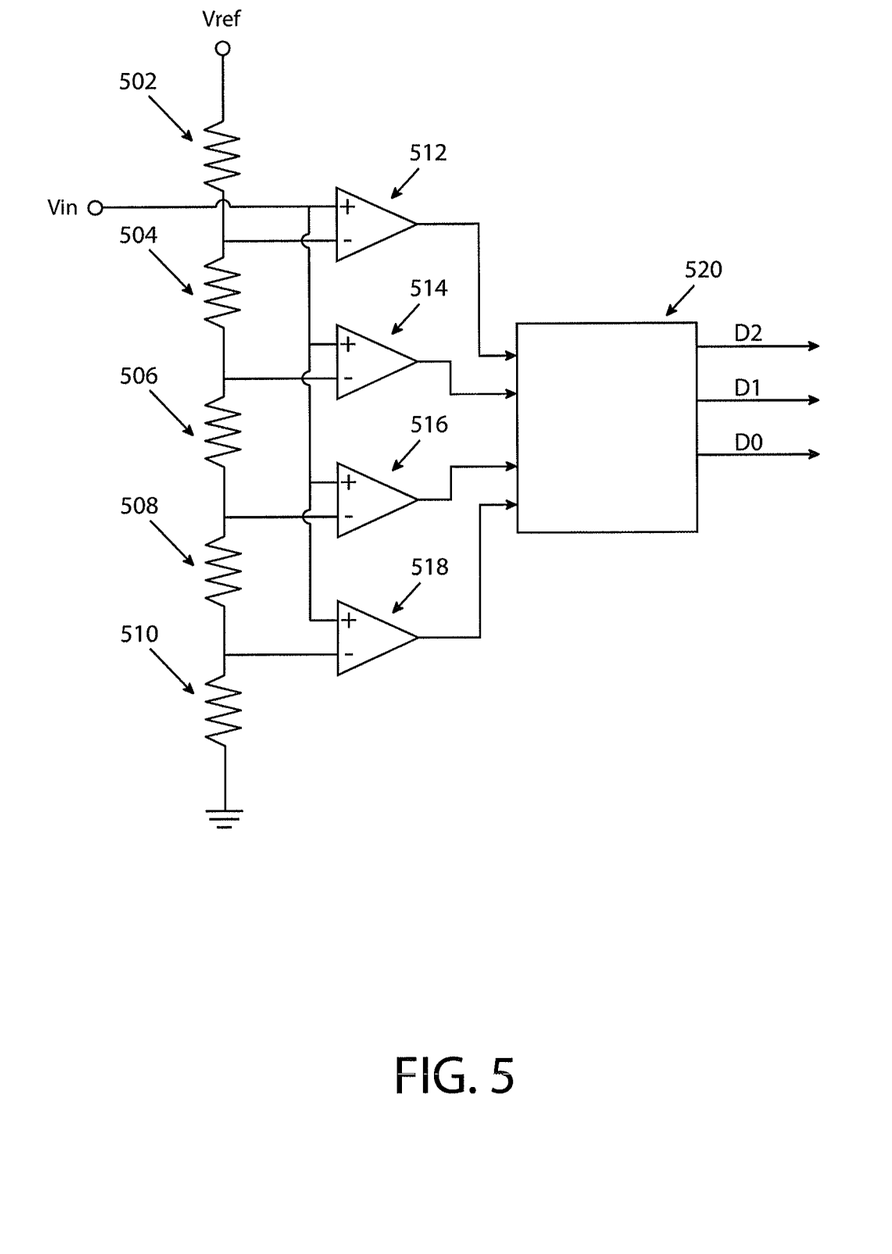
FIG. 5 is a circuit schematic of a receiver that includes an analog to digital converter and a decoder, according to an exemplary embodiment of the present invention.

In the examples shown in FIGS. 2, 3 and 4, the output pulses are received at the receiver and are decoded to determine the original source data sequence. As shown in FIG. 5, the receiver may be an analog to digital converter (ADC) which compares the received pulses to various thresholds to determine their intensities.

For example, the ADC in FIG. 5 includes an input port Vin that receives an electrical representation of the transmitted optical output pulses (i.e., not shown in FIG. 5 is a photo-sensor that converts the received optical pulses into electrical pulses). Since the examples in FIGS. 2, 3 and 4 result in output pulses with four different amplitude levels, the pulses then are compared to four different thresholds through resistors 502, 504, 506, 508, 510 and comparators 512, 514, 516 and 518.

For example, as shown in FIG. 2, pulse 208 may be sampled four times during bit period T. In the first quarter of the bit period (where the pulse is the highest) all four comparators may be triggered. During the second quarter of the bit period, the bottom three comparators 514, 516 and 518 may be triggered. During the third quarter of the bit period, the bottom comparators 516 and 518 may be triggered, and furthermore during the last quarter of the bit period the last comparator 518 may be triggered.

In general, during each of the sample periods (in this example), a two bit digital representation of a given intensity level in decoder 520 is determined (i.e., during the first quarter of the bit period the amplitude is determined to be 11, the second quarter of the bit period the amplitude is determined to be 10, the third quarter of the bit period the amplitude is determined to be 01, and the fourth quarter of the bit period the amplitude is determined to be 00). Thus, in this example, four two bit words represent a single output pulse over bit period T (i.e., eight bits represent the output pulse).

Decoder 520 as shown in FIG. 5 may then convert a sequence of eight bits down to the three original source bits (D0, D1 and D2) corresponding to the three input pulses of the three data streams (e.g. 111). For example, first output pulse 208 as shown in FIG. 2 may produce the sequence 11, 10, 01 and 00 corresponding to the light intensity of pulse 208 in each of the quarters of bit period T. Decoder 520 may then decode these eight bits into the corresponding source bits 111 (i.e., pulse 202, 204 and 206) of the original data stream. Thus, output pulse 208 produces three bits (e.g. 111) of data at the receiver. This process is repeated for all of the received pulses (i.e., each received pulse is analog digital converted and then decoded to determine the three transmission bits that it represents).

Figure 6:
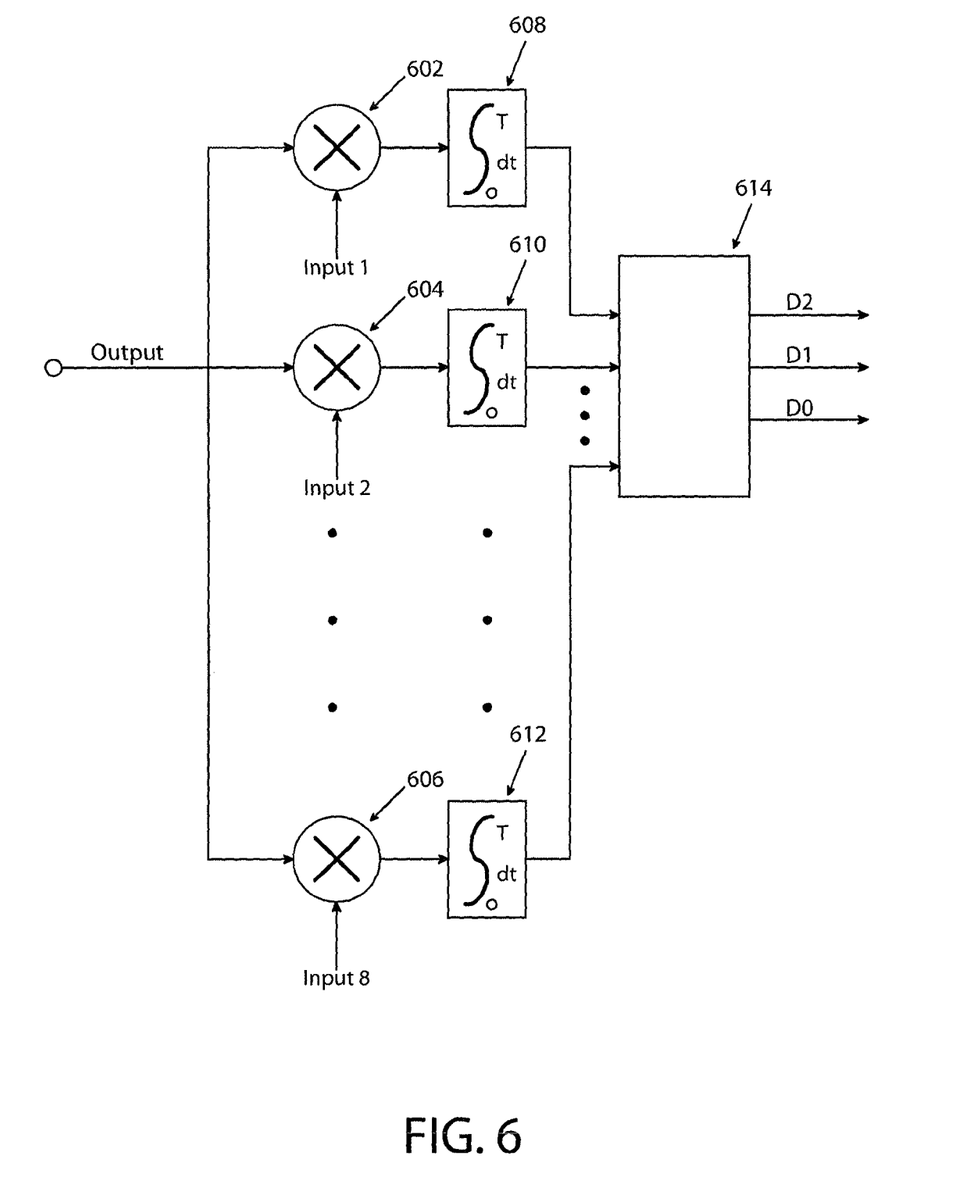
FIG. 6 is a circuit schematic of a correlation receiver, according to an exemplary embodiment of the present invention.

The receiver may alternatively perform different operations to determine the three transmission bits D0, D1 and D2. For example, as shown in FIG. 6, the receiver may be a correlation receiver. In general, the correlation receiver may include a photo-sensor (not shown) which converts the optical pulses (i.e., the output pulses shown in FIGS. 2, 3 and 4) into electrical pulses that are then input to correlators. For example, since there are three data streams and therefore eight different possible output pulses (including the null pulse), then the correlation receiver may include eight different correlations that are performed simultaneously via multipliers 602, 604 and 606 and integrators 608, 610, 612. In this example, the received pulse is correlated with all eight possible transmission pulses to determine the highest correlation. The highest correlation is then input to processor 614 (i.e., a decoder) which determines the three transmission bits D0, D1 and D2 based on the correlation result. For example, if the correlation of the received pulse with pulse 208 as shown in FIG. 2 is the highest correlation, then it is determined that a 111 was transmitted.

Although FIG. 1 shows the superposition of the pulses in the three data streams (i.e., the summation of the pulses in the three data streams) being combined optically, it is also contemplated that the superposition may be performed electrically prior to optical transmission. This example is at least shown in FIG. 7 where the transmitter has three data streams 712, 714 and 716 which have pulses that are summed up electrically by adder 710 before the optical pulse is transmitted. Similar to FIG. 1, a transistor 708, resistor 706, LED 704 and current source 702 are implemented.

Figure 7:
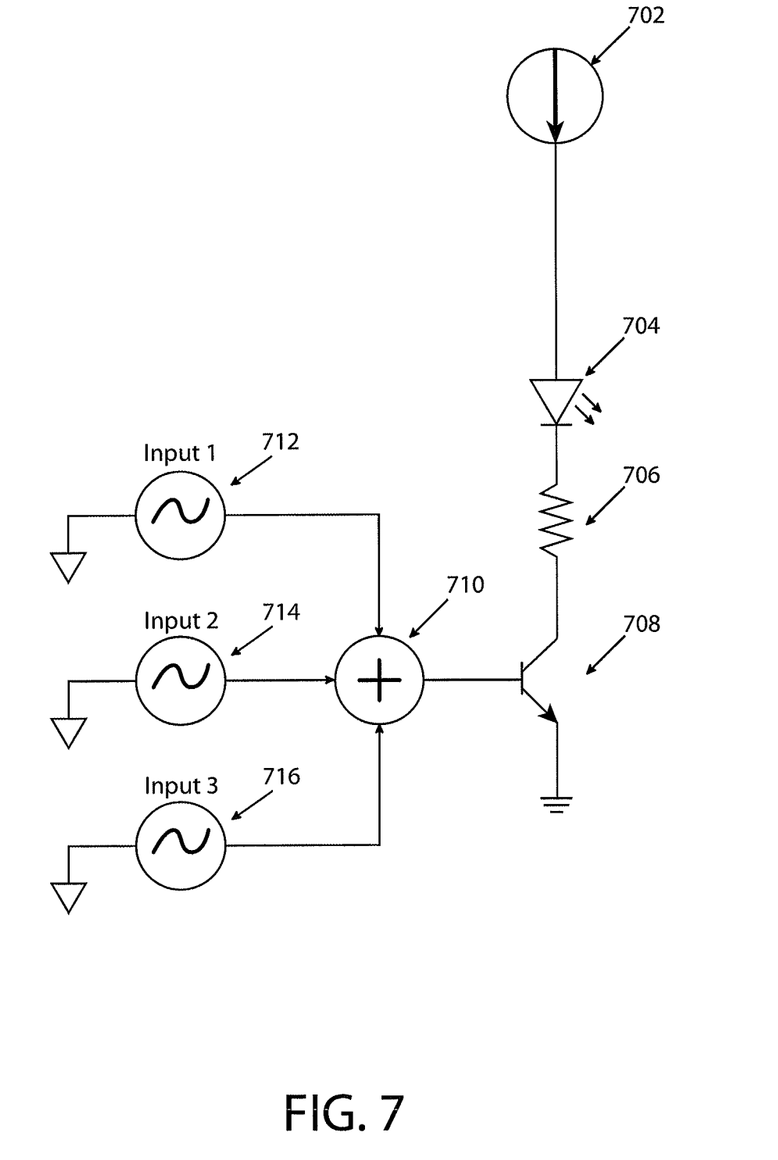
FIG. 7 is a circuit schematic of an optical transmitter having one optical source, according to an exemplary embodiment of the present invention.

For example, during operation, pulses of data streams 712, 714 and 716 are electrically summed (i.e., superposition) which means that the output pulses modulate transistor 708 and therefore the current through LED 704. In this example, only a single LED is utilized because the pulses in the three data streams have already been summed electrically (they do not need to be summed optically). In general, the output from the transmitters in FIGS. 1 and 7 are equivalent. This configuration in FIG. 7 may be beneficial because the electrical pulses may be more easily and accurately added together than the optical pulses as shown in FIG. 1.

Although FIGS. 1 and 7 show an optical transmitter, it is noted that this invention is not limited to optical sources. In general, waves from other radiating sources such as radio frequency (RF) sources, magnetic sources, mechanical sources (i.e. shock waves), thermal sources, chemical sources, etc. may be utilized to produce pulses for superposition.

Figure 8:
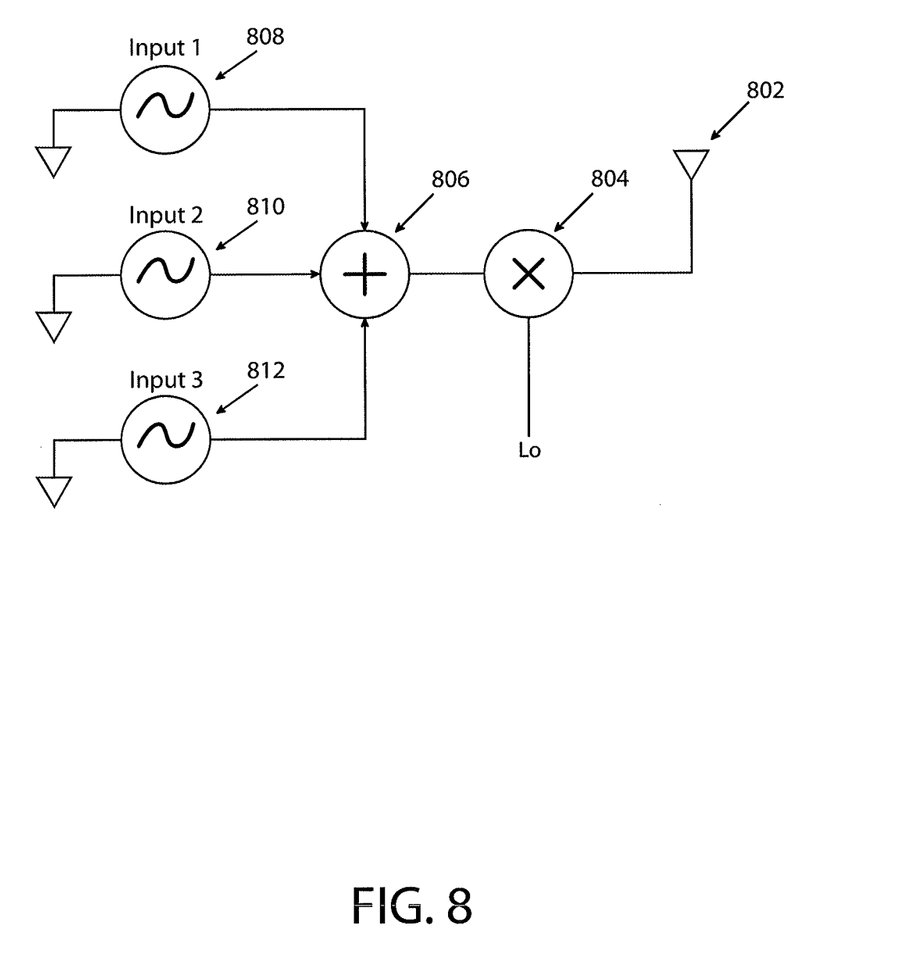
FIG. 8 is a circuit schematic of a radio frequency (RF) transmitter, according to an exemplary embodiment of the present invention.

As shown in FIG. 8, for example, an RF transmitter similar to optical transmitter FIG. 7 may include data streams 808, 810 and 812 and adder 806 to perform the superposition of the pulses in the three data streams. Once the data streams are electrically added together, they may be converted to a higher frequency by modulating the summation output pulses using a local oscillator LO. Once the output pulse has been converted to a higher frequency, it may be transmitted electromagnetically via antenna 802.

Although not shown an RF receiver may be included in the system. The RF receiver may include an antenna, a demodulator, an analog to digital converter or a correlation receiver similar to those shown in FIGS. 5 and 6.

Although the examples in FIGS. 1-8 show three data streams producing three bit output pulses, it is noted that N data streams may be added during superposition to produce $2^N$ possible output pulses. It is also noted that a controller may be included in the transmitter and receiver to coordinate the operations of the various components or perform certain operations such as decoding. This controller may be in the form of a microprocessor or field programmable gate array (FPGA).

For example, as shown in FIG. 1, the data source may be time de-multiplexed by a multiplexer which is controlled by a microprocessor. The A/D converter and correlation receiver shown in FIGS. 5 and 6 may also be synchronized or implemented using a microprocessor.

In general, a data source may be de-multiplexed into N data streams. Each of the data streams may be implemented to have unique pulses to represent a logic bit. These unique pulses may be unique from each other by altering the duty cycle, amplitude, phase shift or a combination of at least two. By having N unique pulses, then $2^N$ unique output pulses after superposition (i.e., after summing the pulses) are possible. This allows each output pulse to be unique from one another and to represent N bits during transmission. In general, this simplifies the transmission process and increases throughput since a single transmission pulse represents N data bits. The original N data bits may be determined from the received pulses by performing operations such as analog to digital conversion, correlation and decoding.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. An optical transmitter for transmitting data, including:
    a pulse generator generating N data streams overlapping in time from a de-multiplexed data source, each respective data stream having pulses with a common shape unique to that respective data stream, the common shape based on at least one of duty cycle, amplitude and phase shift;
    an optical source optically transmitting an output pulse that is generated by summing the uniquely shaped pulses from each respective data stream that are overlapping in time, each output pulse representing N bits of the data source, where N>1; and N light emitting diodes (LEDs) that transmit the N respective data streams, and wherein the output pulse is generated by optically summing the uniquely shaped optical pulses transmitted from the N LEDs.

2. The optical transmitter of claim 1, further comprising:

an adder that electrically sums the uniquely shaped pulses to produce the output pulse, and wherein the optical source is a light emitting diode (LED) that transmits the output pulse.

3. The optical transmitter of claim 1, wherein the N uniquely shaped pulses have unique duty cycles to produce $2^N$ output pulses.

4. The optical transmitter of claim 1, wherein the N uniquely shaped pulses have unique amplitudes to produce $2^N$ output pulses.

5. An optical transmitter for transmitting data, including:

a pulse generator generating N data streams overlapping in time from a de-multiplexed data source, each respective data stream having pulses with a common shape unique to that respective data stream, the common shape based on at least one of duty cycle, amplitude and phase shift; and an optical source optically transmitting an output pulse that is generated by summing the uniquely shaped pulses from each respective data stream that are overlapping in time, each output pulse representing N bits of the data source, where N>1, and wherein the N uniquely shaped pulses have unique phases to produce $2^N$ output pulses.

6. The optical transmitter of claim 1, wherein the N uniquely shaped pulses have at least two of unique duty cycles, unique amplitudes and unique phases to produce $2^N$ output pulses.

* * * * *